United States Patent [19]

Takeda et al.

[11] Patent Number: 4,539,553

[45] Date of Patent: Sep. 3, 1985

[54] DIGITAL-TO-ANALOG CONVERTER OF THE CURRENT-ADDING TYPE

[75] Inventors: Masashi Takeda; Masaru Iwasa, both of Kanagawa, Japan

[73] Assignee: Sony Corporation, Tokyo, Japan

[21] Appl. No.: 480,078

[22] Filed: Mar. 29, 1983

[30] Foreign Application Priority Data

Mar. 30, 1982 [JP] Japan .................................. 57-50183
Apr. 16, 1982 [JP] Japan .................................. 57-62515

[51] Int. Cl.³ ........................................... H03K 13/05
[52] U.S. Cl. .............................................. 340/347 DA
[58] Field of Search ........ 340/347 DA, 347 C, 347 M

[56] References Cited

U.S. PATENT DOCUMENTS

| | | | |
|---|---|---|---|
| 4,034,366 | 7/1977 | Memishian, Jr. ............ | 340/347 DA |
| 4,160,244 | 7/1979 | Solomon et al. ............ | 340/347 DA |
| 4,338,591 | 7/1982 | Tuthill ....................... | 340/347 DA |
| 4,354,175 | 10/1982 | Goldstein ................... | 340/347 DA |
| 4,396,907 | 8/1983 | Wintzer et al. ............. | 340/347 DA |
| 4,492,954 | 1/1985 | Harris et al. ................ | 340/347 DA |

Primary Examiner—Vit W. Miska
Attorney, Agent, or Firm—Lewis H. Eslinger; Alvin Sinderbrand

[57] ABSTRACT

A digital-to-analog converter of the current-adding kind includes n input buffer circuits to which the bits of the digital signal are applied in parallel, a first ladder resistor network having n resistors connected in series to which complementary outputs of the input buffer circuit are connected, a second ladder resistor network for dividing output terminal voltages from the first ladder resistor network into $2(2^n-1)$ voltages, $(2^n-1)$ switching circuits having inputs connected to voltage dividing points of the second resistor network, and a common summing resistor connected to the outputs of the switching circuits to add currents supplied thereto, thereby providing an analog voltage having a level corresponding to the numerical value of the digital input signal.

31 Claims, 15 Drawing Figures

FIG.8
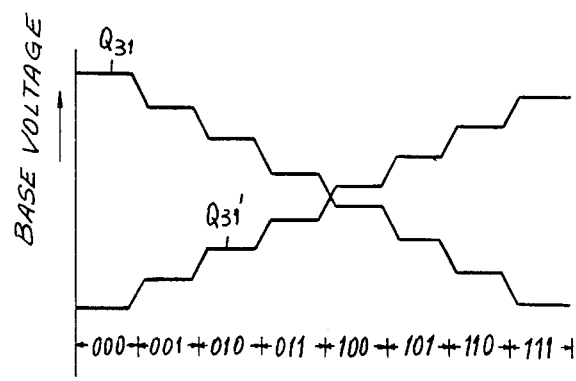
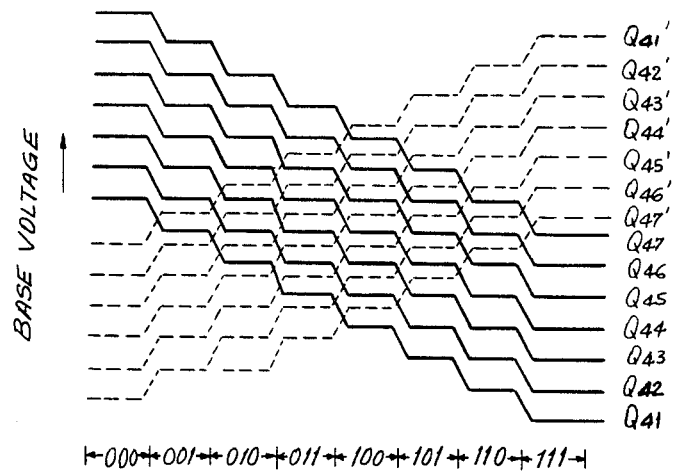
FIG.9

DIGITAL-TO-ANALOG CONVERTER OF THE CURRENT-ADDING TYPE

BACKGROUND OF THE INVENTION

1. Field of the Invention

The present invention relates generally to digital-to-analog converters of the current-adding kind and, more particularly, relates to a digital-to-analog converter of the current-adding kind that minimizes the number of active components necessary to perform the conversion.

2. Description of the Prior Art

In known digital-to-analog converters of the current-adding kind specifically intended to convert a binary-coded digital signal to an analog signal, when the number of bits in the input binary word is increased, the number of elements in the digital-to-analog converter must be greatly increased. In fact, the number of active components in known digital-to-analog converters will increase exponentially with corresponding increases in the number of bits in the binary-coded digital signal. This is particularly disadvantageous when the converter circuitry is formed as an integrated circuit, since the area of the integrated circuit chip that must be occupied by the converter circuitry becomes inordinately large. Thus, it not only becomes difficult to fabricate integrated circuits of such larger size but is contrary to the original intent of maintaining circuit size as small as possible.

An example of a prior art digital-to-analog converter of the current-adding kind is shown in FIG. 1. In FIG. 1 the somewhat heavier or darker circuit lines relate to the elements of a conversion circuit to convert a binary-coded digital signal, wherein the binary words are made up of two bits. The respective bits of the two-bit digital input signal are supplied to input terminals $T_1$ and $T_2$ and the analog output signal is produced at output terminal $T_0$. The input signals supplied to input terminals $T_1$ and $T_2$ are fed to buffer circuits 1a and 1b, respectively, with each buffer circuit consisting of an emitter coupled logic (ECL) transistor pair, which is shown in detail in FIG. 2A. The output of input buffer circuits 1a and 1b are fed to combination gate circuits 2a and 2b, respectively, which are the functional equivalent of NOR gates and are shown in detail in FIG. 2B. A transistor matrix circuit is shown generally at 3 and receives the outputs from NOR gates 2a and 2b. The outputs from transistor matrix circuit 3 are fed to switching circuits 4a, 4b, and 4c that produce the output signals to be summed across a common summing resistor $R_0$. In this conversion circuit, intended for use with two-bit binary-coded digital words, the possible digital input signals "0 0", "0 1," "1 0," and "1 1" are supplied to input terminals $T_1$ and $T_2$, and the current eventually flowing through a common or summing resistor $R_0$ will be representative of these input signals and will have relative values of 0, 1, 2, and 3, respectively. The prime notation symbols in the drawings and in the following description represent an inverted logic level, thus, A' is A inverted. The various currents flowing through common resistor $R_0$ will be in a stepped relationship as they change values. For example, when the digital signal "1 0" is supplied to input terminals $T_1$ and $T_2$, that is, when a logic 1 is applied to terminal $T_1$ and a logic 0 is applied to input terminal $T_2$ the outputs A, A', B, and B' are supplied from input buffer circuits 1a and 1b, shown in detail in FIG. 2A, to the combination gate circuits 2a, 2b, and 2c, shown in detail in FIG. 2A. Only combination gate circuit 2b will produce an output since these circuits perform a NOR logic function and circuit 2b has inputs of A' equals 0 and B equals 0. Thus, the output of gate 2b becomes a "1", thereby causing transistors $Q_5$ and $Q_4$ in transistor matrix circuit 3 to turn ON or become conductive. The result of transistors $Q_4$ and $Q_5$ becoming conductive is that switching circuits 4c and 4b, respectively, each being of the emitter coupled logic (ECL) configuration, turn ON or become conductive as well, thus, a current given by $I_1+I_2$ flows through common resistor $R_O$. Assuming that currents $I_1$ equal $I_2$ equal $I_0$, then at the output terminal $T_0$ the voltage derived is given by $2\ I_0 \cdot R_0$.

As another example, when the digital input signal "1 1" is applied to input terminals $T_1$ and $T_2$, combination gate circuit 2a is the only NOR gate one that will produce an output, since it has inputs A' and B'. Thus, transistors $Q_1$, $Q_2$, and $Q_3$ in transistor matrix circuit 3 will be turned ON and become conductive, thereby producing a voltage at the input of all three of switching circuits 4a, 4b, and 4c and causing those switching circuits to turn ON. Therefore, if the assumption that $I_1$ equal $I_2$ equal $I_3$ equal $I_0$ is satisfied, then a voltage equal to $3 I_0 \cdot R_0$ will appear across common resistor $R_0$.

Continuing this example, and assuming an input of "0 1", since combination gate circuit 2c has inputs A and B' equal to zero, an output will be produced to turn ON transistor $Q_6$ in transistor matrix circuit 3. The effect of turning ON transistor $Q_6$ is to cause only switching circuit 4c to turn ON and produce a voltage output across resistor $R_0$ equal to $I_0 \cdot R_0$. Note that because of the input arrangement of NOR gates 2a, 2b, and 2c, in the case of digital input word "0 0" there will be no current flowing since none of NOR gates 2a, 2b, 2c, will turn ON and therefore all currents $I_1$, $I_2$, $I_3$ will be zero. Thus, it may be seen that using the prior art circuit shown in FIG. 1 the digital-to-analog conversion of "0 0" will result in 0; of "0 1" will result in 1; of "1 0" will result in 2; and of "1 1" will result in 3.

The above description is relative to the circuits shown in heavy lines in FIG. 1 relating to a two-bit binary circuit. Nevertheless, it also is known in the prior art to provide digital-to-analog conversion using this same circuit approach for three-bit input words and, thus, the remaining lines of lesser weight in FIG. 1 show the circuitry involved in that conversion. An additional input buffer circuit 1c having an input terminal $T_3$ is provided and seven combination gate circuits 2a, 2b, 2c, 2d, up to 2g are required to accept the combinations of the three-bit input words, that is, A B C', A B' C, A B' C', A' B C, A' B C', A' B' C, and A' B' C'. Similarly, transistor matrix circuit 3 will require a large increase in the number of transistors making up each stage and, specifically, will require twenty-eight transistors in order to count all of the digits that the three-bit input word can represent, that is, $7+6+5+4+3+2+1=28$. An additional number of switching circuits will also have to be provided and, specifically, seven switching circuits 4a to 4g will be required. In the general case the transistor matrix circuit 3 will require $2^n(2^n-1)/2$ transistors for an input bit word having n number of bits to be converted by this prior art circuit. Therefore, the number of transistors is seen to increase exponentially in accordance with the number of bits in the binary-coded signal to be converted. It can therefore be appreciated that the area that must be occupied in an integrated circuit chip in order to provide this conversion circuitry becomes quite large, and the cost of fabrication of such chip becomes prohibitive.

OBJECTS AND SUMMARY OF THE INVENTION

Accordingly, it is an object of the present invention to provide a digital-to-analog converter of the current-adding kind, wherein the number of active components required is minimized compared to known converters of this kind.

It is another object of the present invention to provide a digital-to-analog converter of the current adding kind in which a ladder resistor network is employed to decrease the number of active components required.

According to one aspect of the present invention a digital-to-analog converter of the current adding kind is provided that comprises input buffer circuits to which the digital signal is applied and including a first ladder resistor section formed of n resistors that are connected in series and to which complementary outputs of the input buffer circuits are connected and a second ladder resistor section for dividing output terminal voltages from the first ladder resistor section into a number of voltages given by ($2^n1$). These switching circuits then have input terminals connected to voltage dividing points in the second ladder resistor section and a common resistor is connected to the switching circuits that acts to sum the currents that are supplied to the switching circuits.

The above and other objects, features, and advantages of the present invention will become apparent from the following detailed description of an illustrative embodiment that is to be read in conjunction with the accompanying drawings, in which the same reference numerals identify the corresponding elements and parts in the several views.

BRIEF DESCRIPTION OF THE DRAWINGS

FIG. 8 is a diagram of the base voltages of transistors $Q_{31}$ and $Q'_{31}$ of the converter shown in FIG. 7;

FIG. 9 is a diagram of the voltages present at specified points in the ladder resistor network of the converter of FIG. 7;

DESCRIPTION OF PREFERRED EMBODIMENTS

Figure 1:
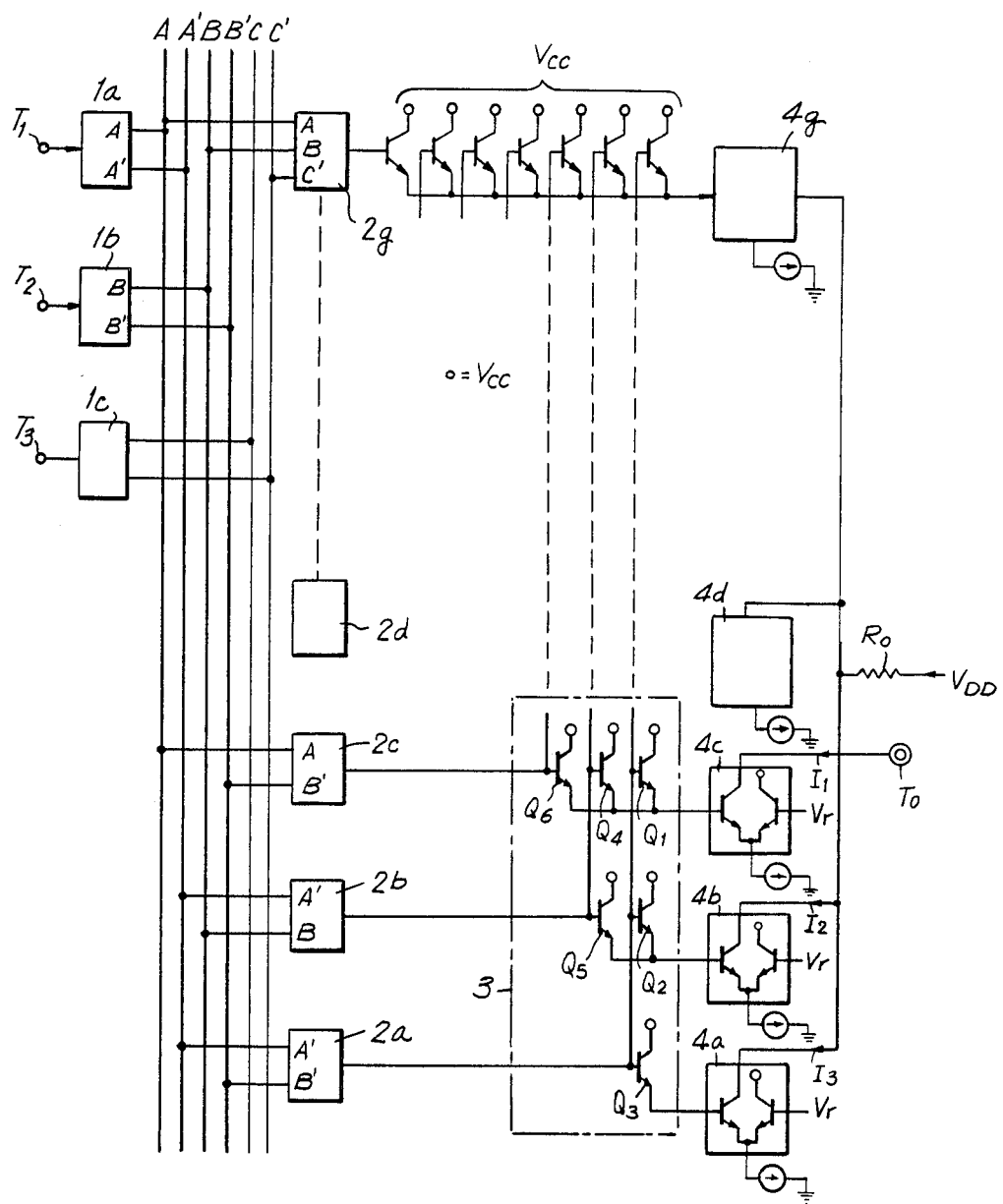
FIG. 1 is a schematic diagram of a digital-to-analog converter of the current-adding kind known in the prior art.
Figure 2A:
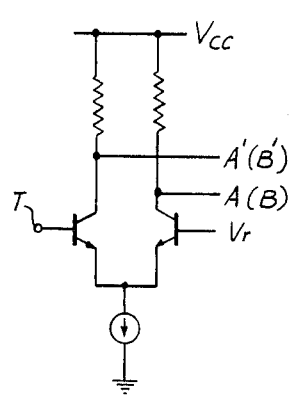
FIGS. 2A and 2B are schematic diagrams showing circuit elements found in the prior art digital-to-analog converter of FIG. 1 in more detail.
Figure 2B:
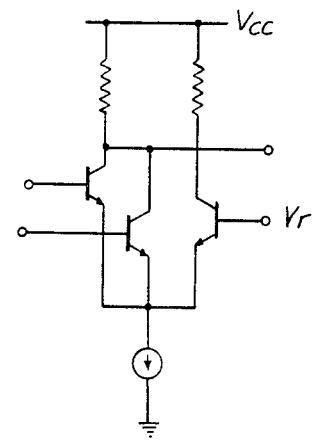
Figure 3:
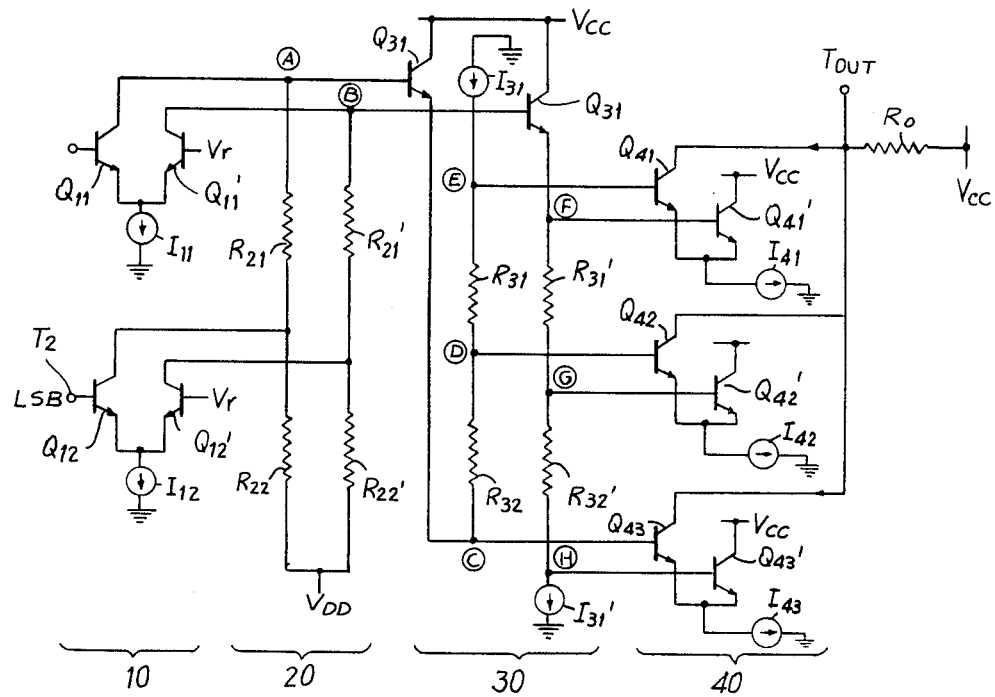
FIG. 3 is a schematic diagram of a 2-bit digital-to-analog converter of the current-adding kind according to the present invention.

The prior art converter shown in FIGS. 1, 2A, and 2B having already been discussed, attention is now directed to the digital-to-analog converter as taught by the present invention, one embodiment of which is shown in FIG. 3. This digital-to-analog converter of the current-adding kind is intended to handle a two-bit digital input signal. The digital-to-analog converter of FIG. 3 may be viewed as being divided into functional sections referred to generally as input buffer section 10, first ladder resistor section 20, second ladder resistor section 30, and switching circuit section 40.

Input buffer section 10 is formed of two pairs of transistors connected in emitter coupled logic configuration and, more specifically, transistors $Q_{11}$ and $Q'_{11}$ form the first pair to which is connected input terminal $T_1$ and the second pair is formed of transistors $Q_{12}$ and $Q'_{12}$ to which is connected input terminal $T_2$. In regard to transistor pair $Q_1$ and $Q'_1$, the emitters are connected together to ground potential through a current source $I_{11}$ and, similarly, the transistor pair $Q_{12}$ and $Q'_{12}$ have their emitters coupled and connected to ground potential through current source $I_{12}$. The collector circuits of transistors $Q_{11}$ and $Q'_{11}$ are connected to resistors $R_{21}$ and $R'_{21}$, respectively, while the collector circuits of transistors $Q_{12}$ and $Q'_{12}$ are connected to the other ends of resistors $R_{21}$ and $R'_{21}$, respectively. First ladder resistor section 20 is formed of resistors $R_{21}$ and $R_{22}$ connected in series and resistors $R'_{21}$ and $R'_{22}$ also connected in series, with the collector circuits of transistors $Q_{12}$ and $Q'_{12}$ connected, respectively, to the voltage dividing points in these two series-connected resistor circuits. The other ends of resistors $R_{22}$ and $R'_{22}$ are tied together and connected to voltage source $V_{DD}$. Also connected to resistors $R_{21}$ and $R'_{21}$ are the base circuits of transistors $Q_{31}$ and $Q'_{31}$, respectively. These transistors are both connected in the emitter follower configuration, and the output of transistor $Q_{31}$ is connected to one end of series-connected resistors $R_{32}$ and $R_{31}$ and the output of transistor $Q'_{31}$ is connected to one end of series-connected resistors $R'_{31}$ and $R'_{32}$. These four resistors form second ladder resistor section 30. The free ends of the serially connected resistors $R_{31}$ and $R_{32}$ and $R'_{31}$ and $R'_{32}$ are connected to ground through current sources $I_{31}$ and $I'_{31}$, respectively. Switching circuit section 40 has its inputs connected to the voltage dividing points of second ladder resistor circuit 30 and, specifically, connected to one end of resistor $R_{31}$ is the base lead of transistor $Q_{41}$ connected at the voltage dividing point of series-connected resistors $R'_{31}$ and $R_{32}$ is the base lead of transistor $Q_{42}$, and connected at the other end of resistor $R_{32}$ is the base lead of transistor $Q_{43}$. Similarly, connected at one end of resistor $R'_{31}$ is the base lead of transistor $Q'_{41}$, connected at the voltage dividing point of resistors $R'_{31}$ and $R'_{32}$ is the base lead of transistor $Q'_{42}$, and connected at the other end of resistor $R'_{32}$ is the base lead of transistor $Q'_{43}$. The currents flowing in the collector circuits of transistors $Q_{41}$, $Q_{42}$, and $Q_{43}$ are added through a common resistor $R_0$ and the voltage across resistor $R_0$ is available the output at terminal $T_0$. The transistor pairs $Q_{41}$ and $Q'_{41}$ are connected in emitter coupled logic configuration and the emitters are connected to ground potential through current source $I_{41}$; transistors $Q_{42}$ and $Q'_{42}$ are connected in emitter coupled logic configuration and the emitters are connected to ground potential through current source $I_{42}$; and transistors $Q_{43}$ and $Q'_{43}$ are connected in emitter coupled logic configuration and the emitters are connected to ground potential through current source $I_{43}$.

Figure 4:
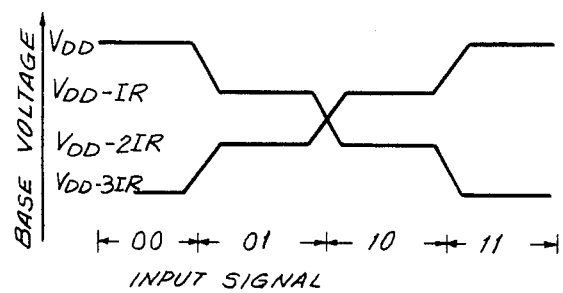
FIG. 4 is a diagram of the base voltages of transistors $Q_{31}$ and $Q'_{31}$ of the converter of FIG. 3.
Figure 5:
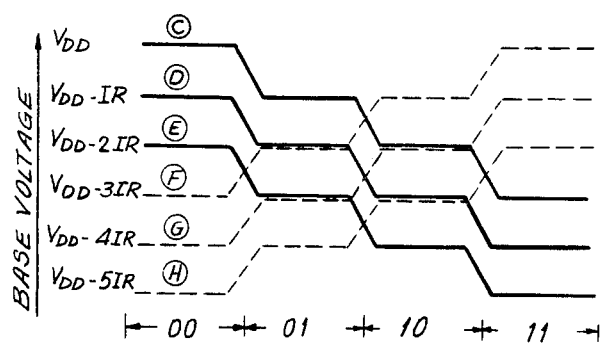
FIG. 5 is a diagram of the voltages present at specified points in the ladder resistor network of the converter of FIG. 3.
Figure 6:
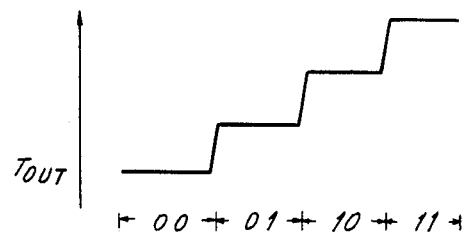
FIG. 6 is a diagram of the output voltage produced by the inventive digital-to-analog converter shown in FIG. 3.

FIGS. 4, 5, and 6 represent various voltages that are present during operation of the inventive circuit shown in FIG. 3 and by means of these voltage levels the operation of the converter of FIG. 3 can be described. FIG. 4 shows the base voltages of transistors $Q_{31}$ and $Q'_{31}$, which vary in level in response to the digital signals applied to input terminals $T_1$ and $T_2$, respectively. Specifically, waveform A is the voltage at the base circuit of transistor $Q_{31}$ and waveform B is the voltage at the base circuit of transistor $Q'_{31}$. When the input digital signal is "0 0", transistors $Q'_{11}$ and $Q'_{12}$ are both OFF, whereas transistors $Q_{11}$ and $Q_{12}$ are both ON. Thus, the base voltage of transistor $Q_{31}$ will be high, while the base voltage of transistor $Q'_{31}$ will be low. This is shown in FIG. 4 by the two voltage levels for the interval corresponding to the input signal "0 0". When the digital input signal to terminals $T_1$ and $T_2$ is "0 1", transistor $Q_{12}$ will then turn ON, while transistor $Q'_{12}$ will turn OFF. Thus, the base voltage of transistor $Q_{31}$ will be lowered by a voltage determined by the drop across resistor $R_{22}$ ($I_{12} \times R_{22}$), while the base voltage at transistor $Q'_{31}$ will be increased by a voltage given by the drop across resistor $R'_{22}$($I_{12} \times R'_{22}$), since the current produced by current source $I_{12}$ that normally flows through resistor $R'_{22}$ will not be present when transistor $Q'_{12}$ is turned OFF.

Similarly, when the digital input signal is "1 0" or "1 1" the base voltage of transistor $Q_{31}$ will be lowered in a step-wise fashion, whereas the base voltages of transistor $Q'_{31}$ will be likewise raised. These base voltage changes are seen in FIG. 4 at the intervals corresponding to the various binary input signals.

Now, assuming that the resistance values of resistors $R_{21}$, $R'_{22}$, $R'_{21}$, and $R'_{22}$ are all equal to a generalized resistor value R, and the current supplied by the constant current sources $I_{11}$ and $I_{12}$ are all equal to a generalized current value I, then the base voltages at points A and B of transistors $Q_{31}$ and $Q'_{31}$, respectively, are as set forth in the following chart in response to all possible variations of the two-bit input digital signal.

| Input Digital Signal | A | B |
| --- | --- | --- |
| 0 0 | $V_{DD}$ | $V_{DD}$-3IR |
| 0 1 | $V_{DD}$-IR | $V_{DD}$-2IR |
| 1 0 | $V_{DD}$-2IR | $V_{DD}$-IR |
| 1 1 | $V_{DD}$-3IR | $V_{DD}$ |

Referring now to FIG. 5, the voltages at various points in second ladder resistor circuit 30 of FIG. 3 are shown. More specifically, FIG. 5 shows the actual base voltages applied to transistors $Q_{41}$, $Q_{42}$, and $Q_{43}$ and to transistors $Q'_{41}$, $Q'_{42}$, and $Q'_{43}$. Comparing the waveforms of FIG. 5 with the circuit of FIG. 3 it will be seen that when the two-bit digital signal is "0 0" the base voltages of transistors $Q_{41}$, $Q_{42}$, $Q_{43}$, that is, the voltages at points E, D, and C, respectively, are all higher than the base voltages of transistors $Q'_{41}$, $Q'_{42}$, and $Q'_{43}$, thus, the collector currents of transistors $Q_{41}$, $Q_{42}$, and $Q_{43}$ are the currents provided by the current sources $I_{41}$, $I_{42}$, and $I_{43}$, respectively. Therefore, the voltage or potential at output terminal $T_0$ across summing resistor $R_0$ will be relatively low. This is shown in FIG. 6.

When the digital input signal is "0 1", the base voltage of transistor $Q_{41}$ becomes lower than that of transistor $Q'_{41}$, as seen in FIG. 5 at indications 0. As a result, the current flowing through resistor $R_0$ will be also lowered by the amount of current supplied by current source $I_{41}$ and, thus, the potential at output terminal $T_0$ will be raised by a corresponding amount.

When the two-bit digital input signal changes to "1 0", the base voltages of transistors $Q_{42}$ and $Q'_{42}$ will be inverted with respect to each other, as indicated in FIG. 5 at the marks Δ, and transistor $Q_{42}$ will also turn OFF. Similarly, when the two-bit digital input signal becomes "1 1" transistor $Q_{43}$ also becomes OFF, as shown at marks X in FIG. 5. Therefore, the potential at output terminal $T_0$ is sequentially increased step by step as shown in FIG. 6 as the various combinations of the two-bit input signal increase in numerical value.

Now, assuming once again that the resistance values of resistors $R_{31}$, $R_{32}$, $R'_{31}$, and $R'_{32}$ are all equal to the resistance values of the earlier discussed resistors $R_{21}$, $R_{22}$, $R'_{21}$, and $R'_{32}$, that all resistance values may be given by the general value R, and that the current supplied by the constant current sources $I_{31}$, $I'_{31}$ are equal to a generalized current value I, then the voltages at each node C, D, E, F, G, and H in the circuit of FIG. 3 will be as set forth in the following chart. Note that in the chart the forward voltage drop $V_{be}$ of transistors $Q_{31}$ and $Q'_{31}$ are equal and negligible.

| Input Digital Signal | C | D | E | F | G | H |
| --- | --- | --- | --- | --- | --- | --- |
| 0 0 | $V_{DD}$ | $V_{DD}$-IR | $V_{DD}$-2IR | $V_{DD}$-3IR | $V_{DD}$-4IR | $V_{DD}$-5IR |
| 0 1 | $V_{DD}$-IR | $V_{DD}$-2IR | $V_{DD}$-3IR | $V_{DD}$-2IR | $V_{DD}$-3IR | $V_{DD}$-4IR |
| 1 0 | $V_{DD}$-2IR | $V_{DD}$-3IR | $V_{DD}$-4IR | $V_{DD}$-IR | $V_{DD}$-2IR | $V_{DD}$-3IR |
| 1 1 | $V_{DD}$-3IR | $V_{DD}$-4IR | $V_{DD}$-5IR | $V_{DD}$ | $V_{DD}$-IR | $V_{DD}$-2IR |

In this situation when the digital signal is "1 1", the current generated by current sources $I_{41}$, $I_{42}$, and $I_{43}$, is taken as $I_0$, and the potential difference between the adjacent steps is $I_0 \times R_0$. Thus, the following conversions are performed for the various digital input signals: "00" becomes 0; "01" becomes 1; "10" becomes 2; and "11" becomes 3. In this case, if the input terminals to the transistor $Q_{41}$ and the transistor $Q'_{41}$, are interchanged, then the current flowing through the common resistor $R_0$ can be set to correspond with "00" becomes 1; "01" becomes 1; "10" becomes 2; and "11" becomes 3. Similar results may be obtained by interchanging the appropriate input leads to transistors $Q_{42}$, $Q'_{42}$, $Q_{43}$, and $Q'_{43}$.

Figure 7:
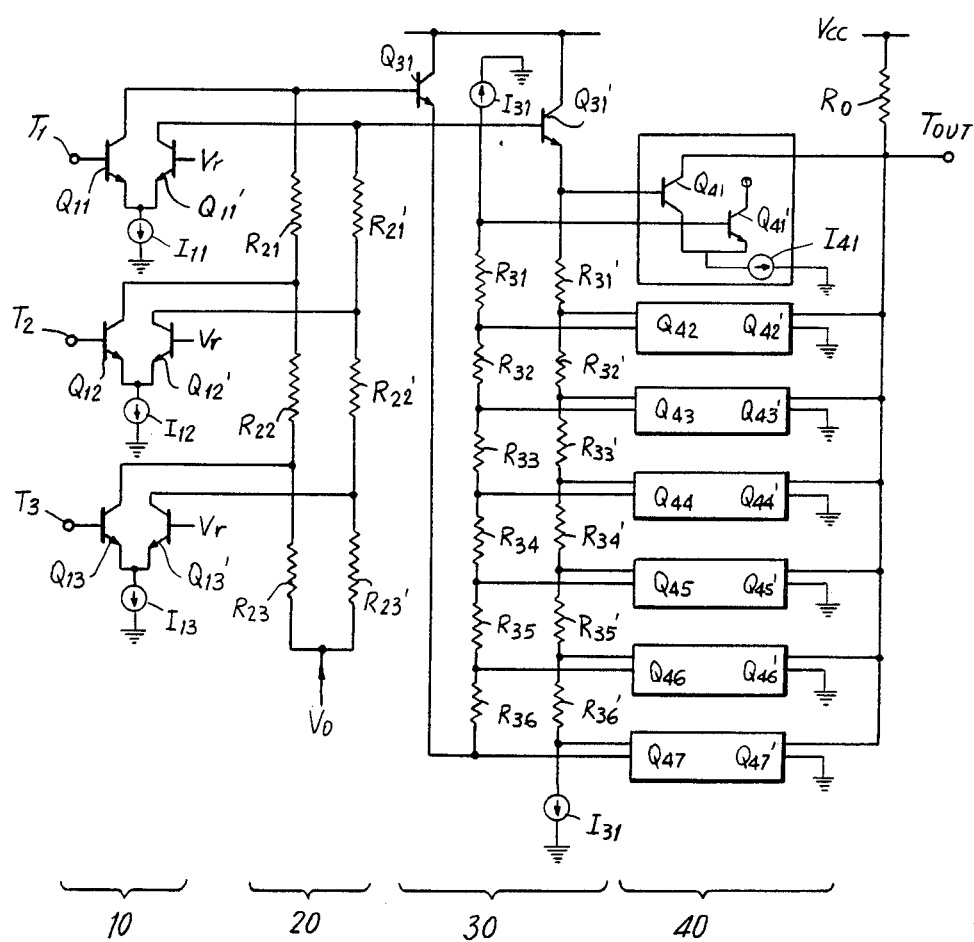
FIG. 7 is a schematic diagram of a three-bit digital-to-analog converter of the current-adding kind according to the present invention.

Referring now to FIG. 7, another embodiment of the digital-to-analog converter of the current-adding kind provided by the present invention is shown, and this embodiment is intended to accept digital signals formed of three-bit words. Because there are many similarities between the embodiment of FIG. 7 and the embodiment of FIG. 3, only the differences therebetween will be discussed herein. For example, one pair of emitter coupled transistors $Q_{13}$ and $Q'_{13}$ are added to input buffer section 10, and having their emitters connected to ground potential through current source $I_{13}$. Input terminal $T_3$ is connected to transistor $Q_{13}$. Similarly, in first ladder resistor section 20 resistor pair $R_{23}$ and $R'_{23}$ are added, to which are connected the collector circuits of the transistor pair $Q_{13}$ and $Q'_{13}$, respectively. In second ladder resistor section 30 series-connected resistors $R_{33}$, $R_{34}$, $R_{35}$, and $R_{36}$ are added as are series-connected resistors $R'_{33}$, $R'_{34}$, $R'_{35}$, and $R'_{36}$, which also entail the addition of additional switching circuits, shown generally as blocks in FIG. 7, and consisting of transistor pairs $Q_{43}$ and $Q'_{43}$, $Q_{44}$ and $Q'_{44}$, $Q_{45}$ and $Q'_{45}$, $Q_{46}$ and $Q'_{46}$, $Q_{47}$ and $Q'_{47}$.

FIG. 8 represents the levels of the base voltages present at transistors $Q_{31}$ and $Q'_{31}$ of FIG. 7 in this three-bit digital-to-analog converter. These various voltage levels are generated in response to the three-bit digital signals applied to the input terminals $T_1$, $T_2$, and $T_3$ and, thus, the base voltages of transistors $Q_{31}$ and $Q'_{31}$ are changed in the eight-step manner shown in FIG. 8. These voltage changes are further converted to eight smaller voltage steps in the second ladder resistor section 30 as represented by the signal levels of FIG. 9, which are then compared with one another in switching circuit section 40 in the next stage of the digital-to-analog converter. Therefore, as represented in FIGS. 8 and 9, in utilizing the circuit of FIG. 7 the digital input signals that may be fed to the three bit digital-to-analog converter will result in the following conversions: "000" becomes 0; "001" becomes 1; "010" becomes 2; "011" becomes 3; "100" becomes 4; "101" becomes 5; "110" becomes 6; and "111" becomes 7.

As may be seen by comparing the circuits embodied in of FIGS. 3 and 7, an increase of ten active elements in the converter is required by the expansion of only one bit in the input signal. More specifically, when the input is expanded from a two-bit word to a three-bit word, two elements must be added in input buffer section 10 and eight elements must be added in switching section 40. In general, in order to convert an n-bit digital signal, $2n + (2^n - 1)2$ active elements are required. Nevertheless, it should be understood that, according to the present invention, the the number of active elements is reduced substantially compared with that in the prior art converter of FIG. 1. While in the above examples emitter coupled logic (ECL) circuits are used in the input buffer section 10 and switching circuit section 40, it is possible to use logic circuits of other kinds in substitution therefor. Additionally, as may be seen from the above description, because the inventive circuit employs the four different generic sub-sections, that is, input buffer section 10, first and second ladder resistor sections 20 and 30, and switching circuit section 40, and because the increase active elements required by the addition of a single input bit is not as large as in the prior art, the present invention lends itself quite advantageously to occupying a relatively small chip area when the converter is formed as an integrated circuit.

Figure 10:
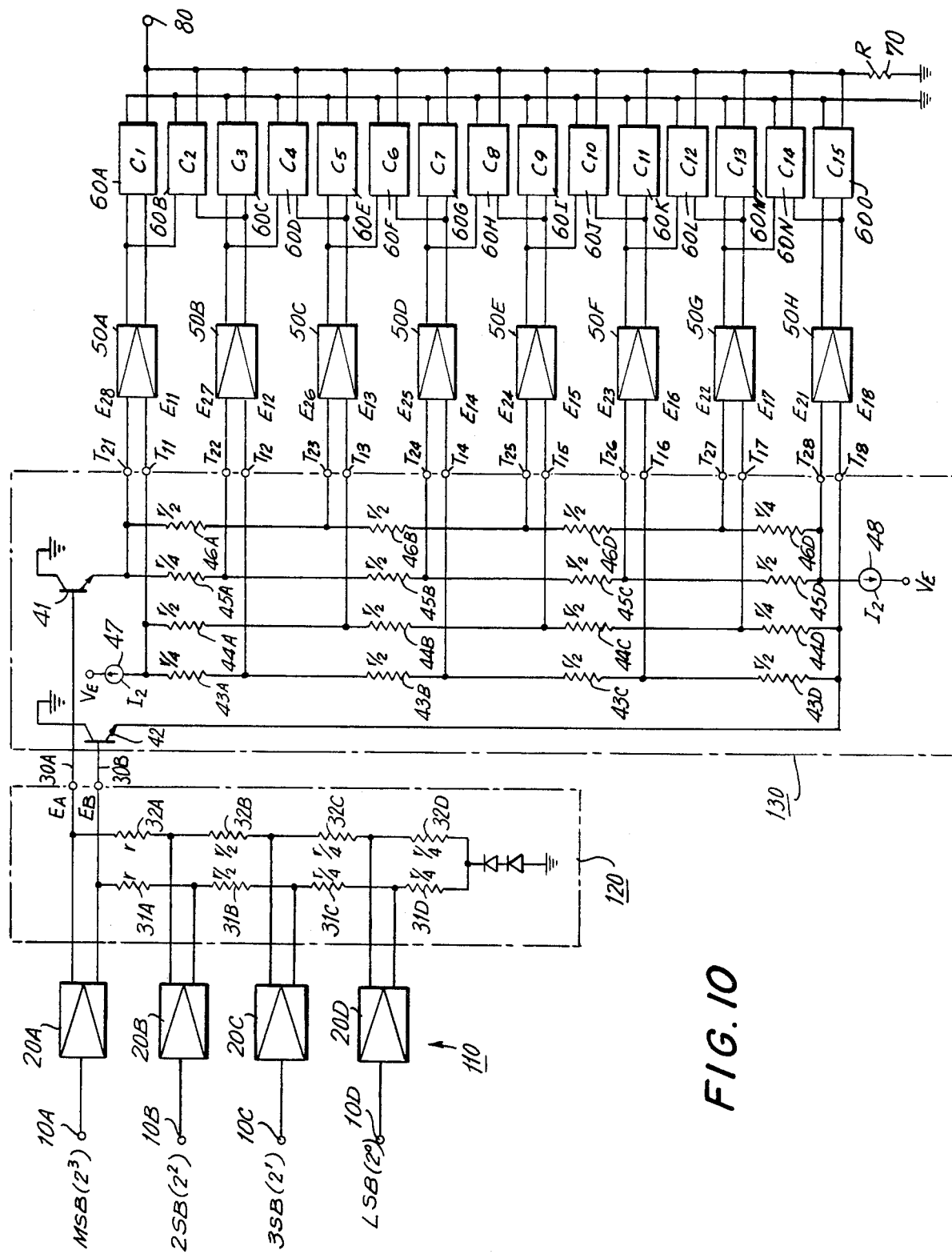
FIG. 10 is a schematic diagram of a four-bit digital-to-analog converter of the current-adding kind according to the present invention.

FIG. 10 is another embodiment of an analog-to-digital converter of the current-adding kind according to the present invention, and this embodiment converts a four-bit digital input signal into an analog signal. In this embodiment, the number of resistors in the second ladder resistor circuit and in the buffer amplifier circuit can be decreased in relation to the above-described embodiments. More specifically, the individual bits of the four bit digital signal are loaded in parallel at input terminals 10A, 10B, 10C, and 10D to be fed through respective input buffer circuits 20A, 20B, 20C, and 20D to a first ladder resistance section, shown generally at 120. The most significant bit MSB ($2^3$) of the digital input signal is supplied to first signal input terminal 10A, the second significant bit 2SB ($2^2$) to second input terminal 10B, the third significant bit 3SB ($2^1$) to third signal input terminal 10C, and the least significant bit LSB ($2^0$) to fourth signal input terminal 10D. Each input buffer circuit 20A through 20D has the same configuration, shown for example in FIG. 11, wherein general input terminal 10' is connected to the base circuit of transistor 21 connected in emitter follower configuration to drive emitter coupled logic transisitor pair 22 and 23, the emitters of which are connected to the supply potential $V_E$ through a constant current source 24. A reference voltage $V_r$ is applied to the base circuit of transistor 23, and the outputs of the input buffer circuit are taken from the collector circuits of transistors 22 and 23. In the operation of input buffer circuit 20', transistors pair 22 and 23 operate conversely according to the digital input signal, that is, a constant current $I_1$ is supplied by constant current source 24 through either of these two transistors to first ladder resistance section as shown in FIG. 10.

First ladder resistance section 120 includes a first circuit comprising four series-connected resistors 31A, 31B, 31C, and 31D and a second circuit also comprising four series-connected resistors 32A, 32B, 32C, and 32D. The output current $I_1$ of constant current source 24 is supplied to first ladder resistance circuit resistors 31A–31D from the transistor 23 of the circuit of FIG. 11 through the respective input buffer circuits 20A–20D, similarly, the constant current $I_1$ from constant current source 24 is also fed to second ladder resistors 32A–32D from corresponding transistors 22 found in each input buffer circuit 20A–20D. The values of the resistors 31A–31D that make up first resistor circuit and the values of the resistors 32A–32D that make up the second resistor circuit are selected to be in the ratios of $1:\frac{1}{2}:\frac{1}{4}:\frac{1}{8}$, respectively.

The output of this first ladder resistance section 120 is at terminals 30A and 30B, where potentials $E_A$ and $E_B$, respectively, are present. The potential appearing at terminals 30A and 30B can have various values, according to the levels of the digital input signals applied to terminals 10A–10D.

Figure 11:
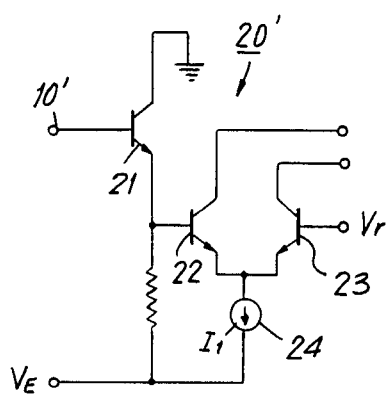
FIG. 11 is a schematic diagram showing a circuit element of the converter of FIG. 10 in more detail.

As may be seen from the circuit of FIG. 11, the potentials $E_A$ and $E_B$ that are present, respectively, at the output terminals 30A and 30B of first ladder resistance section 120 are complementary to each other and are coupled, respectively, to the base circuits of first and second transistors 41 and 42 arranged in second ladder resistance section 130.

Second ladder resistance section 130 is made up of four separate resistor circuits each having four resistors connected in series, that is, series resistors 43A, 43B, 43C, and 43D form a first circuit, series resistors 44A, 44B, 44C, and 44D form a second circuit; series resistors 45A, 45B, 45C, and 45D form a third circuit; and series resistors 46A, 46B, 46C, and 46D form a fourth circuit. Constant current source 47 producing current $I_2$ is connected to the first and second resistor circuits and, specifically, to the free ends of resistors 43A and 44A. A second constant current source 48 also producing a current $I_2$ is connected to the third and fourth resistor circuits at the free ends of resistors 45D and 46D. The other ends of the first and second series-connected resistor circuits, that is, the free ends of resistors 43D and 44D are connected to the emitter circuit of transistor 42. Similarly, the other ends of the third and fourth series-connected resistor circuits, that is, the free ends of resistors 45A and 46A are connected to the emitter circuit of transistor 41. The ratio of the various resistor values making up second ladder resistance circuit 130 are such that resistor 43A, connected to constant current source 47, has a resistance value r/4, while the other three resistors making up this particular first ladder, 43B through 43D have a resistance r/2, of the four resistors 44A through 44D making up the second resistor circuit, each of the three series-connected resistors 44A, 44B, and 44C that are connected to constant current source 47 have a resistance value of r/2, while the remaining resistor 44D has a resistance of r/4, of the four resistors making up the third resistor circuit, resistor 45A that is connected to the emitter circuit of transistor 41 has a resistance r/4, while the other three series-connected resistors 45B, 45C, and 45D have a resistance of r/2, and of the four resistors making up the fourth resistor circuit, series-connected resistors 46A, 46B, and 46C connected to the emitter circuit of transistor 41 and have a resistance r/2, while resistor 46D connected to constant current source 48 has a value of r/4.

Figure 12:
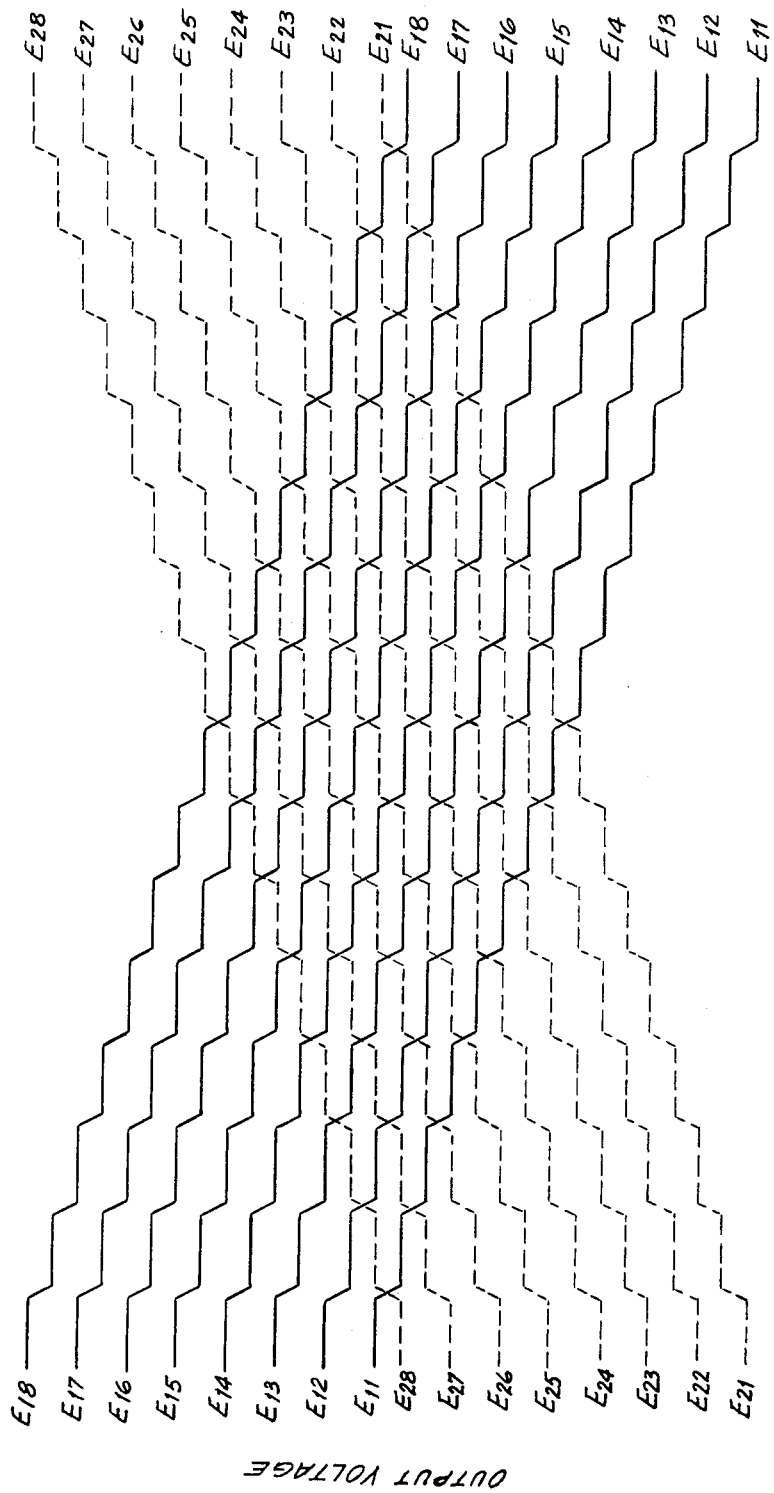
FIG. 12 is a diagram of the output voltages produced by the inventive digital-to-analog converter of FIG. 10.

In the second ladder resistance section 130 as described above, the first and second resistor circuits 43A-43D and 44A-44D provide eight stages of voltage division for the potential $E_A$ obtained as an output from first ladder resistance section 120. More particularly, the eight potentials that can exist at point $E_A$ may be given as $E_{1n}$, where n is any number from 1 through 8, as shown by the solid lines in FIG. 12. These solid lines represent the relative voltage levels present at the several terminals $T_{1n}$ according to the various numerical values of the digital input signal fed to terminals 10A through 10D. Similarly, at the several terminals $T_{2n}$ of the eight stages of the third and fourth resistor circuits there are respective potentials $E_{2n}$, shown by the dashed lines in FIG. 12, corresponding to the various input signals at terminals 10A through 10B.

Referring again to the circuit of FIG. 10, the output terminals $T_{1n}$ and $T_{2n}$ of the second ladder resistance section 40 are coupled, respectively, through eight buffer amplifiers 50A through 50H to fifteen level comparator circuits 60A through 60O.

Figure 13:
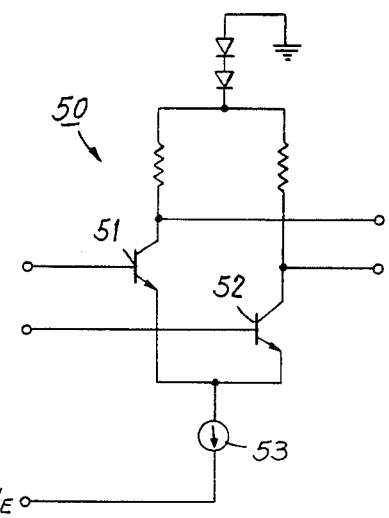
FIG. 13 is a schematic diagram showing a circuit element of the converter of FIG. 10 in more detail.

The eight buffer amplifers 50A through 50F are substantially identical and one typical construction thereof is shown in FIG. 13. This buffer amplifier is essentially a differential amplifier consisting of first transistor 51 and second transistor 52 arranged so that the emitter circuits thereof are commonly connected to a constant current source 53 that is connected to the potential $V_E$. The inputs to this differential amplifier circuit are connected to the base circuits of transistors 51 and 52, with the outputs being taken from the collector circuits.

Figure 14:
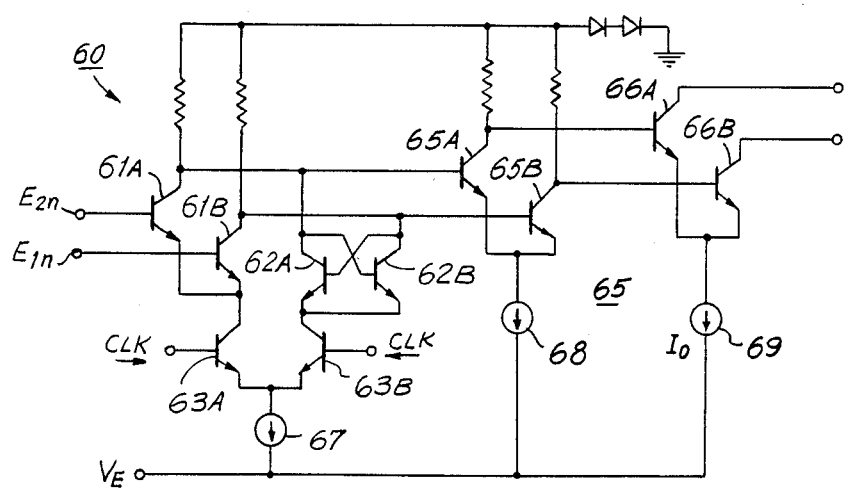
FIG. 14 is a schematic diagram showing a circuit element of the inventive converter of FIG. 10 in more detail.

The fifteen individual level comparators 60A through 60O are similarly all constructed substantially identically, and an advantageous embodiment thereof is shown in FIG. 14. In level comparator 60, six transistors are employed, 61A, 61B, 62A, 62B, 63A, and 63B, which are connected in a known configuration to function as a latch. A differential amplifier section that acts as an internal buffer is formed of transistors 65A and 65B and a switching section is formed of transistor 66A and 66B. The collector circuits of transistors 66A and 66B comprise the outputs of level comparator 60.

Of the first six transistors, 61A and 61B compare the levels of input signals $E_{1n}$ and $E_{2n}$ coupled to the respective base circuits. These transistors have the emitters commonly connected to the collector circuit of transistor 63A. Transistors 62A and 62B are connected in the conventional configuration to comprise a latch circuit to latch the comparison output from transistors 61A and 61B. Transistors 62A and 62B have their emitters commonly connected to the collector circuit of transistor 63B. Transistors 63A and 63B serve to switch the operation of the level comparison and the switching operation. Transistors 63A and 63B have their emitters commonly connected to constant current source 67 and switching is obtained by applying opposite phase clock signals CLK to the respective base circuits. It is this portion of the comparator that performs the actual level comparison, and transistors 61A and 61B perform the level comparison when transistor 63A is turned ON by the appropriate clock pulse. The level comparison output is then latched by use of transistors 62A and 62B when transistor 63B is pulsed ON by the appropriate clock signal.

The internal buffer formed of transistors 65A and 65B provides the level comparison output to the switching section formed of transistors 66A and 66B. Transistors 65A and 65B have their emitters commonly connected to constant current source 68 and, in the switching section, transistors 66A and 66B also have their emitters commonly connected to constant current source 69. Transistors 66A and 66B are conversely operated for switching action according to the level comparison output from the level comparator transistors, as described above.

In the individual level comparator units 60A-60O, the collector of each transistor 66B in the switching section is commonly connected to an output resistor 70 shown in FIG. 10. The fifteen level comparators then supply a constant current $I_0$ from the constant current source 69 (of FIG. 14) to the output resistor 70 based upon the logical value of the level comparison output.

Of the potentials $E_{1n}$ and $E_{2n}$ obtained from the second ladder resistance section 130, the potentials $E_1(N+1-n)$ and $E_2(n)$ are level compared by each of the level comparators 60A, 60C, 60E, 60G, 60I, 60K, 60M, and 60O. Similarly, the potentials $E_1(N-n)$ and $E_2(n)$ are compared by each of level comparators 60B, 60D, 60F, 60H, 60J, 60L, and 60N. The level comparators operate to supply a current corresponding to the logical value of the four-bit digital input signal to the output resistor 70.

The following table 1 shows the current through the output resistor 70 in decimal numbers corresponding to the various four-bit digital input signals.

TABLE 1

| Operation of the Level Comparators | | | | | | | | | | | | |
|---|---|---|---|---|---|---|---|---|---|---|---|---|
| DIGITAL INPUT SIGNAL | | | | | | | | | | | | Current |
| M | 2 | 3 | L | | | | Level comparator output | | | | | through |
| S | S | S | S | $C_1$ | $C_2$ | $C_3$ | $C_4$ | $C_5$ | $C_6$ | $C_7$ | $C_8$ | output |

TABLE 1-continued

| | | | | Operation of the Level Comparators | | | | | | | | |
|---|---|---|---|---|---|---|---|---|---|---|---|---|
| B | B | B | B | $E_{11}{:}E_{28}$ | $E_{11}{:}E_{27}$ | $E_{12}{:}E_{27}$ | $E_{12}{:}E_{26}$ | $E_{13}{:}E_{26}$ | $E_{13}{:}E_{25}$ | $E_{14}{:}E_{25}$ | $E_{14}{:}E_{24}$ | resistor |
| 0 | 0 | 0 | 0 | 0 | 0 | 0 | 0 | 0 | 0 | 0 | 0 | 0 |
| 0 | 0 | 0 | 1 | 1 | 0 | 0 | 0 | 0 | 0 | 0 | 0 | 1 |
| 0 | 0 | 1 | 0 | 1 | 1 | 0 | 0 | 0 | 0 | 0 | 0 | 2 |
| 0 | 0 | 1 | 1 | 1 | 1 | 1 | 0 | 0 | 0 | 0 | 0 | 3 |
| 0 | 1 | 0 | 0 | 1 | 1 | 1 | 1 | 0 | 0 | 0 | 0 | 4 |
| 0 | 1 | 0 | 1 | 1 | 1 | 1 | 1 | 1 | 0 | 0 | 0 | 5 |
| 0 | 1 | 1 | 0 | 1 | 1 | 1 | 1 | 1 | 1 | 0 | 0 | 6 |
| 0 | 1 | 1 | 1 | 1 | 1 | 1 | 1 | 1 | 1 | 1 | 0 | 7 |
| 1 | 0 | 0 | 0 | 1 | 1 | 1 | 1 | 1 | 1 | 1 | 1 | 8 |
| 1 | 0 | 0 | 1 | 1 | 1 | 1 | 1 | 1 | 1 | 1 | 1 | 9 |
| 1 | 0 | 1 | 0 | 1 | 1 | 1 | 1 | 1 | 1 | 1 | 1 | 10 |
| 1 | 0 | 1 | 1 | 1 | 1 | 1 | 1 | 1 | 1 | 1 | 1 | 11 |
| 1 | 1 | 0 | 0 | 1 | 1 | 1 | 1 | 1 | 1 | 1 | 1 | 12 |
| 1 | 1 | 0 | 1 | 1 | 1 | 1 | 1 | 1 | 1 | 1 | 1 | 13 |
| 1 | 1 | 1 | 0 | 1 | 1 | 1 | 1 | 1 | 1 | 1 | 1 | 14 |
| 1 | 1 | 1 | 1 | 1 | 1 | 1 | 1 | 1 | 1 | 1 | 1 | 15 |

| DIGITAL INPUT SIGNAL | | | | | | | | | | | Current through output resistor |
|---|---|---|---|---|---|---|---|---|---|---|---|
| MSB | 2SB | 3SB | LSB | Level comparator output | | | | | | | |
| | | | | $C_9$ $E_{15}{:}E_{24}$ | $C_{10}$ $E_{15}{:}E_{23}$ | $C_{11}$ $E_{16}{:}E_{23}$ | $C_{12}$ $E_{16}{:}E_{22}$ | $C_{13}$ $E_{17}{:}E_{22}$ | $C_{14}$ $E_{17}{:}E_{21}$ | $C_{15}$ $E_{18}{:}E_{21}$ | |
| 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 1 |
| 0 | 0 | 1 | 0 | 0 | 0 | 0 | 0 | 0 | 0 | 0 | 2 |
| 0 | 0 | 1 | 1 | 0 | 0 | 0 | 0 | 0 | 0 | 0 | 3 |
| 0 | 1 | 0 | 0 | 0 | 0 | 0 | 0 | 0 | 0 | 0 | 4 |
| 0 | 1 | 0 | 1 | 0 | 0 | 0 | 0 | 0 | 0 | 0 | 5 |
| 0 | 1 | 1 | 0 | 0 | 0 | 0 | 0 | 0 | 0 | 0 | 6 |
| 0 | 1 | 1 | 1 | 0 | 0 | 0 | 0 | 0 | 0 | 0 | 7 |
| 1 | 0 | 0 | 0 | 0 | 0 | 0 | 0 | 0 | 0 | 0 | 8 |
| 1 | 0 | 0 | 1 | 1 | 0 | 0 | 0 | 0 | 0 | 0 | 9 |
| 1 | 0 | 1 | 0 | 1 | 1 | 0 | 0 | 0 | 0 | 0 | 10 |
| 1 | 0 | 1 | 1 | 1 | 1 | 1 | 0 | 0 | 0 | 0 | 11 |
| 1 | 1 | 0 | 0 | 1 | 1 | 1 | 1 | 0 | 0 | 0 | 12 |
| 1 | 1 | 0 | 1 | 1 | 1 | 1 | 1 | 0 | 0 | 0 | 13 |
| 1 | 1 | 1 | 0 | 1 | 1 | 1 | 1 | 1 | 0 | 0 | 14 |
| 1 | 1 | 1 | 1 | 1 | 1 | 1 | 1 | 1 | 1 | 1 | 15 |

Thus, in the above-described embodiment, analog outputs representing by digital numbers, as shown in Table 1, can be obtained at an output terminal 80 according to the logical value of the digital input signals supplied in parallel to the signal input terminals 10A to 10D. In other words the embodiment of FIG. 10 functions as a four-bit digital-to-analog converter. Moreover, the fifteen level comparators 60A to 60O are operated on the basis of the 8-stage potential divisions $E_{1n}$ and $E_{2n}$ provided by the second ladder resistance section 40. Accordingly, the circuit construction of the stage preceding the level comparators 60A to 60O can be simplified, thereby permitting semiconductor circuit integration in a reduced chip size, resulting in improved fabrication yields.

As has been set forth in regard to the above embodiment of the present invention, the signal level of a first input signal is divided by a first ladder resistance circuit consisting of n series resistors to provide n different voltage division signal levels, while the signal level of a second input signal is similarly divided by a second ladder resistance circuit consisting of another n series resistors to provide n different voltage division signal levels, and the (N+1−n)th division signal level (n being 1, 2, . . . N) obtained from the first ladder resistance circuit and the nth division signal level obtained from the second ladder resistance circuit are level compared in N level comparators, while the (N−n)th division signal level obtained from the first ladder resistance circuit and the nth division signal level obtained from the second ladder resistance circuit are compared in N−1 other level comparators, whereby 2N−1 level comparison outputs representing the level difference between the first and second input signals are obtained. Therefore, the circuit construction of the stage preceding each comparator in the multi-output level comparator circuit can be simplified and the number of active or constituent elements of the circuit reduced, so that it is possible to provide a level comparator circuit that permits semiconductor integrated circuit implementation in a reduced chip size and with increased yield.

Although an illustrative embodiment of the invention has been described in detail herein with reference to the accompanying drawings, it is to be understood that the invention is not limited to that precise embodiment, and that various changes and modifications may be effected therein by one skilled in the art without departing from the scope or spirit of the invention, as defined in the appended claims.

What is claimed is:

1. Apparatus for converting an n-bit digital signal to an analog signal having a level corresponding to the numerical value of said n-bit digital signal, comprising:
   a buffer circuit for receiving the bits of said n-bit digital signal in parallel and for producing buffered digital signals therefrom;
   first voltage divider means receiving said buffered digital signals and producing a pair of output signals having voltage levels related to the numerical value of said n-bit digital signal;

second voltage divider means receiving said pair of output signals from said first voltage divider means and having a plurality of voltage dividing nodes, the voltages at said nodes representing outputs of said second voltage divider means;

a plurality of voltage comparator means, each connected to receive a pair of voltages from said voltage dividing nodes of said second voltage divider means for generating output signals based upon the comparison; and output means receiving said output signals from said plurality of comparator means and forming said analog signal therefrom.

2. Apparatus for converting according to claim 1, in which said buffer circuit comprises n pairs of transistors for producing 2n output signals fed to said first voltage divider means.

3. Apparatus for converting according to claim 2, in which said first voltage divider means comprises a resistance ladder network and said 2n output signals are connected to voltage dividing nodes in said resistance ladder network.

4. Apparatus for converting according to claim 2, in which the transistors in said n pairs are connected in emitter coupled logic configuration, the coupled emitters being connected to a source of constant current, and the collector circuits of each transistor pair providing said buffered signals.

5. Apparatus for converting according to claim 1, in which said second voltage divider means includes first and second transistors, the base circuits thereof being connected to said output signals from said first voltage divider means.

6. Apparatus for converting according to claim 1, in which said plurality of voltage comparator means comprise pairs of transistors connected in emitter coupled logic configuration, the output from each pair being fed to said output means.

7. Apparatus for converting according to claim 6, in which the coupled emitters of each of said pairs of emitter coupled logic transistors is connected to ground potential through a constant current source.

8. Apparatus for converting according to claim 1, in which said output means comprises a summing resistance of known value across which said analog signal appears having a voltage level representing the numerical value of said n-bit digital signal.

9. Apparatus for converting according to claim 1, in which said second voltage divider means produces $2(2^n - 1)$ outputs corresponding to selected voltage divided ratios among said nodes.

10. Apparatus for converting according to claim 1, in which said plurality of comparator means comprises $(2^n - 1)$ voltage comparator circuits.

11. A digital-to-analog converter of the current-adding kind for converting an n-bit digital signal to an analog signal, comprising:

first circuit means receiving in parallel the bits of said digital signal and producing two outputs having respective voltage levels based on the numerical value of said n-bit digital signal;

second circuit means receiving said two outputs from said first circuit means and including a resistance network for producing a plurality of divided voltages from said outputs at nodes of said network of said second circuit means;

a plurality of comparator means having inputs connected to said nodes of said second circuit means for producing current level signals based upon comparisons of voltages at selected nodes; and current adding means connected to said current level signals for producing a summed voltage having level corresponding to the numerical value of said n-bit digital input signal.

12. A digital-to-analog converter according to claim 11, in which said first circuit means includes buffer means for receiving the bits of said n-bit digital signal in parallel and for producing buffered digital signals therefrom.

13. A digital-to-analog converter according to claim 12, in which said buffer means comprises n pairs of transistors producing 2n buffered output signals.

14. A digital-to-analog converter according to claim 13, in which said first circuit means includes a second resistance network and said 2n buffered output signals are connected to voltage dividing nodes in said second resistance network.

15. A digital-to-analog converter according to claim 12, in which the transistors of said n pairs of transistors are connected in emitter coupled logic configuration, the coupled emitters being connected to a source of constant current, and the collector circuits of each transistor pair producing said buffered output signals.

16. A digital-to-analog converter according to claim 11, in which said second circuit means includes first and second transistors having base circuits connected to said output signals from said first circuit means for producing said output currents therefrom fed to said voltage resistance networks.

17. A digital-to-analog converter according to claim 11, in which said plurality of comparator means includes pairs of transistors in emitter coupled logic configuration, the output from each pair of transistors being fed to said current adding means.

18. A digital-to-analog converter according to claim 17, in which the coupled emitters of each of said pair of emitter coupled logic transistors is connected to ground potential through a constant current source.

19. A digital-to-analog converter according to claim 11, in which said current adding means comprises a resistance of known value across which appears said analog signal having a level representing the numerical value of said n-bit digital signal.

20. A digital-to-analog converter according to claim 11, in which said second circuit means produces $2(2^n - 1)$ outputs corresponding to selected voltage division ratios among said nodes of said resistance network.

21. A digital-to-analog converter according to claim 11, in which said plurality of comparator means comprises $(2^n - 1)$ voltage comparator circuits.

22. Apparatus for converting n-bit digital signals to corresponding analog voltage levels, comprising:

input circuit means connected to receive in parallel the bits of said n-bit digital signals and for producing buffered output signals therefrom;

first voltage divider means having said buffered output signals connected to a first plurality of voltage dividing nodes formed therein for producing signals having respective voltage levels corresponding to the numerical values of said n-bit digital signals;

second voltage divider means receiving said signals from said first voltage divider and having a second plurality of voltage dividing nodes;

comparator means having a plurality of inputs connected to said second plurality of voltage dividing nodes of said second voltage divider means for comparing selected pairs of voltages present at said second plurality of voltage dividing nodes and producing an output current upon each successful comparison; and current adding means, connected to add all said output currents from said comparators to form said analog signal thereacross.

23. Apparatus for converting according to claim 22, in which said input circuit means comprises n pairs of transistors producing 2n buffered output signals fed to said first voltage divider means.

24. Apparatus for converting according to claim 23, in which said first voltage divider means comprises a resistance ladder network and said 2n output signals are connected to said first plurality of voltage dividing nodes in said resistance ladder network.

25. Apparatus for converting according to claim 23, in which the transistors of said n pairs of transistors are connected in emitter coupled logic configuration, the coupled emitters being connected to a source of constant current, and the collector circuits of each transistor pair providing corresponding pairs of said buffered output signals.

26. Apparatus for converting according to claim 22, in which said second voltage divider means includes first and second transistors having base circuits connected to said signals output from said first voltage divider means for producing output currents therefrom.

27. Apparatus for converting according to claim 22, in which said comparator means includes pairs of transistors connected in emitter coupled logic configuration, the outputs from each pair being fed to said current adding means.

28. Apparatus for converting according to claim 27, in which the coupled emitters of each of said pairs of emitter coupled logic transistors is connected to ground potential through a constant current source.

29. Apparatus for converting according to claim 22, in which said current adding means comprises a summing resistance of known value across which appears the analog voltage having levels representing the corresponding numerical values of said n-bit binary signals.

30. Apparatus for converting according to claim 22, in which said second voltage divider means produces $2(2^n-1)$ outputs corresponding to selected voltage division ratios among said second plurality of voltage dividing nodes.

31. Apparatus for converting according to claim 22, in which said plurality of comparator means comprises $(2^n-1)$ voltage comparator circuits.

* * * * *